US008231808B2

(12) United States Patent
Yang et al.

(10) Patent No.: US 8,231,808 B2
(45) Date of Patent: Jul. 31, 2012

(54) PERCOLATION EFFICIENCY OF THE CONDUCTIVITY OF ELECTRICALLY CONDUCTIVE ADHESIVES

(75) Inventors: Cheng Yang, Hong Kong (CN); Matthew Ming Fai Yuen, Hong Kong (CN); Bing Xu, Amherst, NY (US)

(73) Assignee: Hong Kong University of Science and Technology, Hong Kong (CN)

( * ) Notice: Subject to any disclaimer, the term of this patent is extended or adjusted under 35 U.S.C. 154(b) by 397 days.

(21) Appl. No.: 12/453,810

(22) Filed: May 22, 2009

(65) Prior Publication Data
US 2009/0294734 A1    Dec. 3, 2009

Related U.S. Application Data

(60) Provisional application No. 61/071,922, filed on May 27, 2008.

(51) Int. Cl.
*H01B 1/00* (2006.01)
*H01B 1/02* (2006.01)
*H01B 1/22* (2006.01)
*B32B 5/16* (2006.01)
*B32B 9/00* (2006.01)

(52) U.S. Cl. ........ 252/500; 252/513; 252/514; 428/403; 428/407

(58) Field of Classification Search ....... 252/500–521.6; 428/403, 407
See application file for complete search history.

(56) References Cited

U.S. PATENT DOCUMENTS

| 4,552,690 | A  | * | 11/1985 | Ikeguchi et al. | 252/512 |
|---|---|---|---|---|---|
| 4,716,081 | A  | * | 12/1987 | Ehrreich | 428/403 |
| 5,843,342 | A  | * | 12/1998 | Ehrreich | 252/520.3 |
| 6,010,646 | A  | * | 1/2000 | Schleifstein | 252/500 |
| 7,906,450 | B2 | * | 3/2011 | McMahon | 502/101 |
| 2006/0081819 | A1 | | 4/2006 | Li et al. | |
| 2006/0081820 | A1 | | 4/2006 | Li et al. | |
| 2008/0280190 | A1 | * | 11/2008 | Dopp et al. | 429/44 |

FOREIGN PATENT DOCUMENTS

| EP | 1 825 940 A1 | 8/2007 |
|---|---|---|
| JP | 2003-238889 A | 8/2003 |

OTHER PUBLICATIONS

Li,Yi, et al., "High performance anisotropic conductive adhesives for lead-free interconnects," Soldering & Surface Mount Technology, 2006, pp. 33-39, vol. 18 (2), Emerald Group Publishing Limited.
Moskovits, M., et al., "Conformation of Mono- and Dicarboxylic Acids Adsorbed on Silver Surfaces," J. Am. Chem. Soc., 1985, pp. 6826-6829, vol. 107 (24), American Chemical Society.

(Continued)

*Primary Examiner* — Mark Kopec
*Assistant Examiner* — Jaison Thomas
(74) *Attorney, Agent, or Firm* — The Nath Law Group; Jerald L. Meyer; Stanley N. Protigal

(57) ABSTRACT

An electroconductive bonding material is formed as a Modified Electrically Conductive Adhesive (MECA), and consists of a resin matrix and a modified conductive filler. The resin matrix if formed by providing a thermosetting or thermoplastic resin-based polymer resin. The conductive filler is a metal filler material suitable for use as conductive filler for the resin matrix. The metal filler is modified by applying a material selected from one of halogens, pseudohalogens or their precursors.

29 Claims, 9 Drawing Sheets

OTHER PUBLICATIONS

Zhang, X., et al., "Interaction of Aqueous Iodine Species with $Ag_2O$/Ag Surfaces," Journal of the Electrochemical Society, 2007, pp. F70-F76, vol. 154 (4), The Electrochemical Society.

Gomatam, Rajesh R., et al., "Effects of various adherend surface treatments on fatigue behavior of joints bonded with a silver-filled electronically conductive adhesive," J. Adhesion Sci. Technol., 2005, pp. 659-678, vol. 19 (8), VSP.

Park, Seong-Yong, et al., "Surface Modification of Ag Coated Cu Conductive Metal Powder for Conductive Silicone Sealant Gasket Paste," Materials Science Forum, 2007, pp. 933-936, vols. 534-536, Trans Tech Publications, Switzerland. (Abstract only).

Lu, Daoqiang Daniel, et al., "Recent Advances in Developing High Performance Isotropic Conductive Adhesives," Journal of Adhesion Science and Technology, 2008, pp. 835-851, vol. 22, Koninklijke Brill NV, Leiden, The Netherlands.

Yim, Myung Jin, et al., "Oxidation Prevention and Electrical Property Enhancements of Copper-filled Electrically Conductive Adhesives for Electronic Packaging and Interconnection," Electronic Components and Technology Conference, 2007, pp. 82-88, IEEE.

Li, Yi, et al., "Conductivity Improvement of Isotropic Conductive Adhesives with Short-Chain Dicarboxylic Acids," Electronic Components and Technology Conference, 2004, pp. 1959-1964, IEEE.

Jiang, Hongjin, et al., "Conductivity Enhancement of Nano Silver-Filled Conductive Adhesives by Particle Surface Functionalization," Journal of Electronic Materials, 2005, pp. 1432-1439, vol. 34 (11).

Jiang, Hongjin, et al., "Surface Functionalized Silver Nanoparticles for Ultrahigh Conductive Polymer Composites," Chem. Mater., 2006, pp. 2969-2973, vol. 18 (13), American Chemical Society.

Gokturk, H.S., et al., "Electric and Magnetic Properties of Low Density Polyethylene Filled with Nickel Powders, Fibers and Flakes," ANTEC, 1992, pp. 491-494.

* cited by examiner

PERCOLATION EFFICIENCY OF THE CONDUCTIVITY OF ELECTRICALLY CONDUCTIVE ADHESIVES

RELATED APPLICATION

The present patent application claims priority to Provisional Patent Application No. 61/071,922 filed May 27, 2008, which is filed by the inventors hereof and which incorporated by reference herein.

BACKGROUND

1. Field

The present disclosure relates to a modified electrically conductive adhesive (MECA) formed by mixing the surface-modified conductive fillers and resins. The surface-modification of the conductive fillers can result in formations of a thin layer containing nano-structures of the partially oxidized metal halides or pseudohalides at the surface of the fillers, which can affiliate the electrical conductivity among the conductive fillers after curing the MECAs.

2. Background

Efforts have been made to replace lead-containing solder materials with lead-free conductive adhesives in surface mount technology. The lead-free adhesives have unique mechanical properties, processing properties, thermal properties, and reliability, and they are environmental friendly. Resin-based polymers are used as matrices for preparing electrically conductive adhesives (ECAs) for applications such as electrical joints between a printed circuit board and the surface mount components. FIG. 1 is a SEM photomicrograph of an ECA. The ECA consists of a micropattern of adhesive resin and conductive fillers. In FIG. 1, the fillers appear as the darker portions. Referring to the figure, the dispersant is lighter in color than the silver because of the charging effect. The conductive fillers with a certain loading ratio are responsible for the electrical interconnection while the resin mainly provides the mechanical interconnection. Typically the silver microflake weight ratio is over 75% in a traditional ECA formulation. By way of example, a commercial sample (Epotek H20E) is 85 wt %. Compared with the eutectic Sn/Pb solders, a disadvantage of ECAs is the lower electrical conductivity, thus resulting in poor current carrying capability. ECAs are primarily composed of two parts: conductive fillers, such as silver, gold, or copper, etc., and a resin matrix. Since the resin matrix is electrically insulative, the overall electrical resistance is the sum of the resistance of fillers, the contact resistance among fillers and between fillers and pads. Therefore, improving the contact efficiency and the evenness of dispersion can be two primary strategies to improve the electrical conductivity of the ECAs.

The dimension of the conductive fillers is one of the key factors influencing the conductivity of the ECAs. Micron-sized flake shaped fillers, such as silver micro-flakes, showed excellent performance in electrical conductivity in previous work. Nano-sized filler often results in higher bulk resistivity of the ECA, which is due to the increased number of contact points between filler particles and the consequently increased contact resistance. Smaller fillers can improve the isotropic character in the resin matrix, which is especially useful in the area of high-resolution fine-pitch interconnects.

Electrical percolation is used to describe the conductive property of a composite material which includes materials which may have substantially different properties. In the case of ECAs, the composite material behaves like a matrix polymer but above a threshold concentration, the composite material behaves more like the conductive filler. This ability of the composite material to behave substantially like the filler is called electrical percolation. According to the theory of electrical percolation, the change is the result of the decrease in distance between filler particles and the resultant ability of the particles to interact with each other as electrically charged particles. This is achieved by establishing an active conductive pathway through the conductive filler.

The electrical percolation threshold $p_c$ is a critical value related to the loading density or concentration of the nano-structures, above which long range connectivity can be achieved. Conducting filler-insulating polymer composites become conductors when the filler content reaches a critical value, or threshold percolation, characterized by a sharp increase of the electrical conductivity. The percolation threshold represents a transition from a local to an infinite conducting state.

Typical filler loading for an ECA formulation is over 25 volume percent. Within this range, the materials exceed an electrical percolation threshold and are electrically conductive in all directions after the materials are cured. An example of such a filler is a filler formed with micron-sized silver flakes. Previous researchers studied the surface modification of the fillers using organic surfactants (e.g., stearic acids, C-18 carboxylic acids) in enhancing the similarity of the polarity between the fillers and polymeric matrixes. These surfactants can reduce the viscosity of the conductive adhesives and prevent agglomerations of the inorganic fillers; however, there is a concern that the surfactants decrease the conductivity of the ECAs due to the insulative property of the surfactants. Some attempts have been made to enhance the conductivity by modifying the filler surfaces using aldehydes or carboxylic acids, which have the potential to reduce the adverse affect of oxidation of the inorganic filler materials; however, considering the low conductivity nature of these organic molecules, the improvement is limited. Other attempts have been made to use smaller (nano-sized) filler materials to replace a portion of the micron-sized fillers in order to decrease the sintering temperature of the ECAs; however, this method may result in an increment in contact resistivity because of the increased number of the contact points.

The present subject matter relates to the surface modification of the micron-sized filler materials which are applied in ECAs. The nano-structures formed at the filler surface can alter the wettability and oxidation property of the metal fillers. Different to any other work ever reported, the method presented here can significantly improve the percolation threshold of the modified ECAs by decreasing the use of the conductive fillers down to 20~30 wt %.

SUMMARY

An electroconductive bonding material is formed using a modified conductive filler. The conductive filler is modified by applying a material selected from the group comprising halogens, pseudohalogens or their precursors. Through combining the modified filler with a thermosetting or thermoplastic resin-based polymer resin matrix, a modified electrically conductive adhesive (MECA) is formed.

DETAILED DESCRIPTION

Overview

Figure 1:
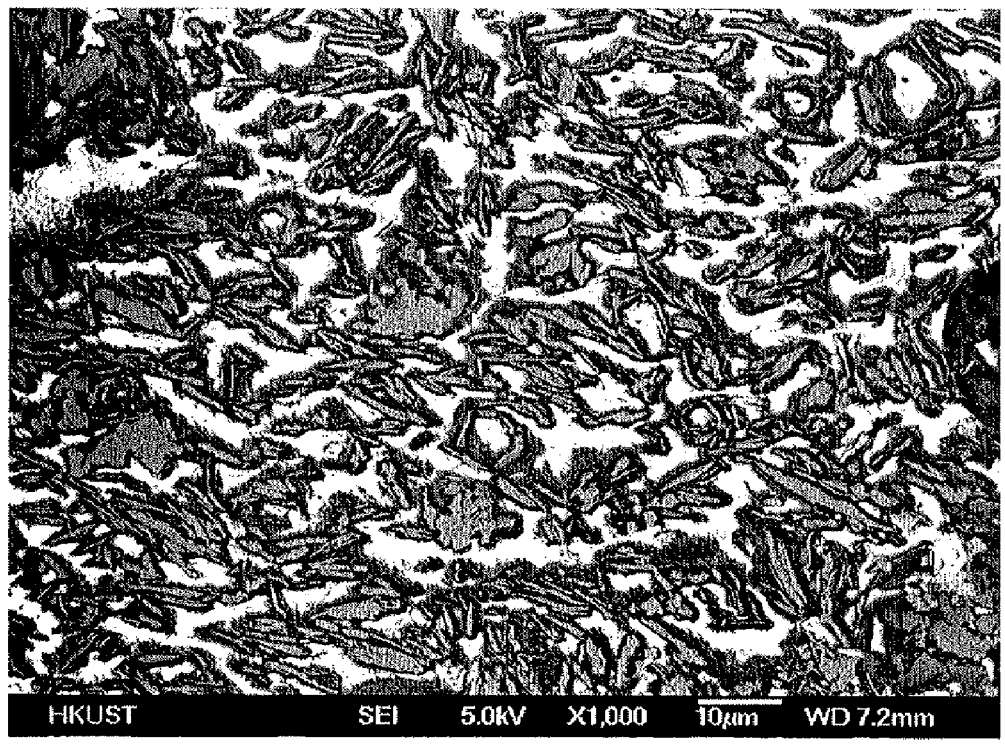
FIG. 1 (prior art) is a SEM photomicrograph of a sectioned electrically conductive adhesive (ECA) which can be used for electrical bonding.

Modified electrically conductive adhesives (MECAs) are capable of being used to bond electrical components in power, ground, and signal transmissions in electrical packaging. In short, the MECAs replace tin/lead solder in electrical packaging. For example, the MECAs of the present disclosure can be applied in interconnection technologies such as, but not limited to, surface mount technology (SMT), chip scale package (CSP), pin-through-hole (PTH), ball grid array (BGA), flip chip technology and stencil printing technology.

Comparing to the peer methods and materials, the present techniques are relatively inexpensive, environmentally friendly, and easy to process. They exhibit low thermo-mechanical stress and have excellent pitch capability. In addition, the MECAs described herein may provide superior properties over currently used MECAs. For example, MECAs of the present disclosure have higher conductivity, lower bulk resistivity, lower thermal expansion property, and contact resistance shift over time.

The MECA including conductive fillers, which can prevent surface contamination and oxidation and improve the wettability between the components. The resulting MECA can also acquire improved thermal expansion property and adhesion strength. This technique can be achieved by the chemical reactions to form metal halides or pseudohalides nano-structure areas.

A conductive adhesive is formed by mixing a variety of conductive fillers into a thermoset or thermoplastic resin. The conductive filler is a metal filler that includes a series of metals, for example, silver, nickel, copper, aluminum, palladium, platinum, gold, combinations thereof, and alloys thereof. The step of forming the conductive adhesive includes treatment of the conductive fillers in a solution of the precursors of the halogens or pseudohalogens and a drying process.

A conductive adhesive is formed by performing a series of processes, which include: a mixing process using a high-shear mixer, a degas process to eliminate the voids in the MECA, and a cure process to solidify the MECA.

The modification the conductive filler provides an improved wettability between the fillers and the resin matrix. The modification reduces formation of metal oxide at surfaces of the metal filler. In addition, the modification method can significantly reduce the conductive percolation threshold as well as the contact resistance of the ECAs.

The disclosed technique is efficient in improving the percolation efficiency of the electrically conductive adhesives (ECAs). The modifying of the conductive fillers generates nano-structures formed of the non-stoichiometrically equivalent metal halides or metal pseudohalides. A series of halogens and pseudohalogens are applied to the conductive filler in order to provide surface pre-modification of the conductive fillers. This treatment can result in the formation of a thin layer of nano-islands at the surface of the conductive fillers. These nano-islands are the complexes of metal halides with abundant metal molecular clusters. The size range of these nano-islands is typically from 0.5 nm to 1 micrometer. The presence of the nano-islands improves the wettability between the filler and the resin matrix by adjusting the polarity of the conductive filler surface. They also prevent oxidation of the conductive filler surface, because the abundant metal clusters inside the nano-islands have very strong reducing ability.

In addition, the modification significantly reduces the contact resistance of the ECAs. As a result, the treatment method affects the electrical conductance of the ECAs both by reducing the bulk resistivity and by the decrease in surface resistance.

MECA Matrix

FIG. 1 (prior art) is a SEM photomicrograph of a sectioned electrically conductive adhesive (ECA) which can be used for electrical bonding. The ECA is used to replace eutectic solders such as lead-containing solder for applications including electrical joints between printed circuit board and the surface mount components. ECAs are primarily composed of two parts: conductive fillers, such as silver, gold, or copper etc., and a resin matrix. If the ECA has a sufficient concentration or density of conductive fillers of a particular type, the conductive fillers are said to have exceeded an electrical percolation threshold and are characterized by conductive properties, such as conductance and resistance. As applied to bonding, the ECA is capable of establishing an ohmic connection when used for electrical bonding.

Figure 2:
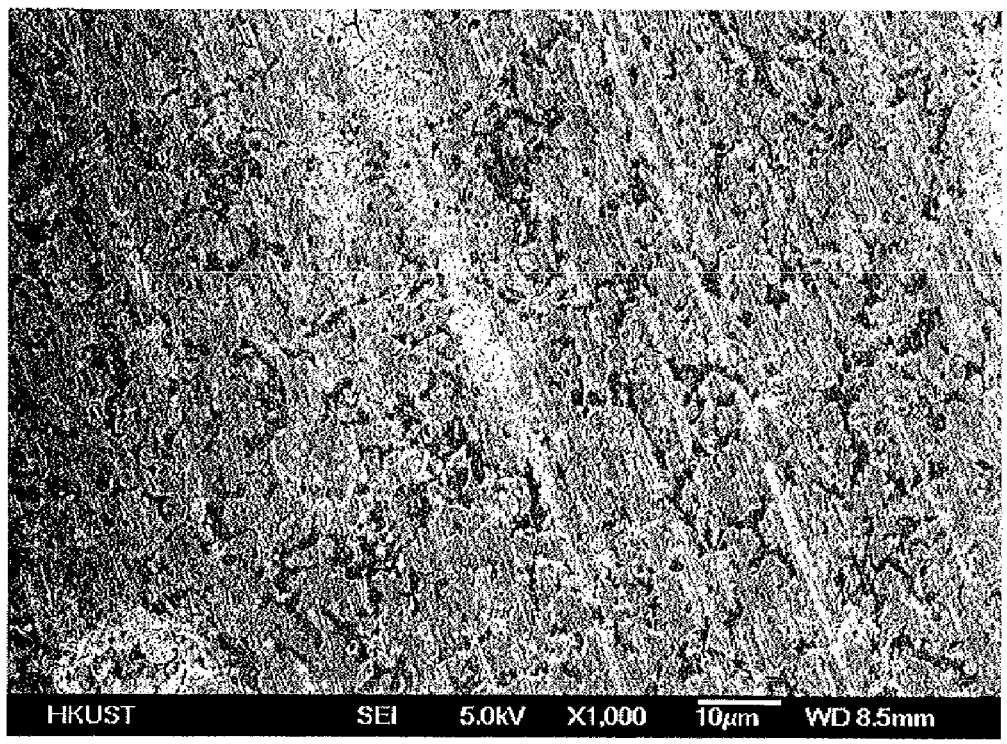
FIG. 2 is a SEM image of the cross-section profile of the MECA sample.

FIG. 2 is a SEM photomicrograph showing an image of the cross-section profile of the MECA sample. The MECA sample was prepared according to EXAMPLE 1, described supra. The conductive filler is a metal filler that exhibits excellent dispersion in the resin matrix.

Figure 3A:
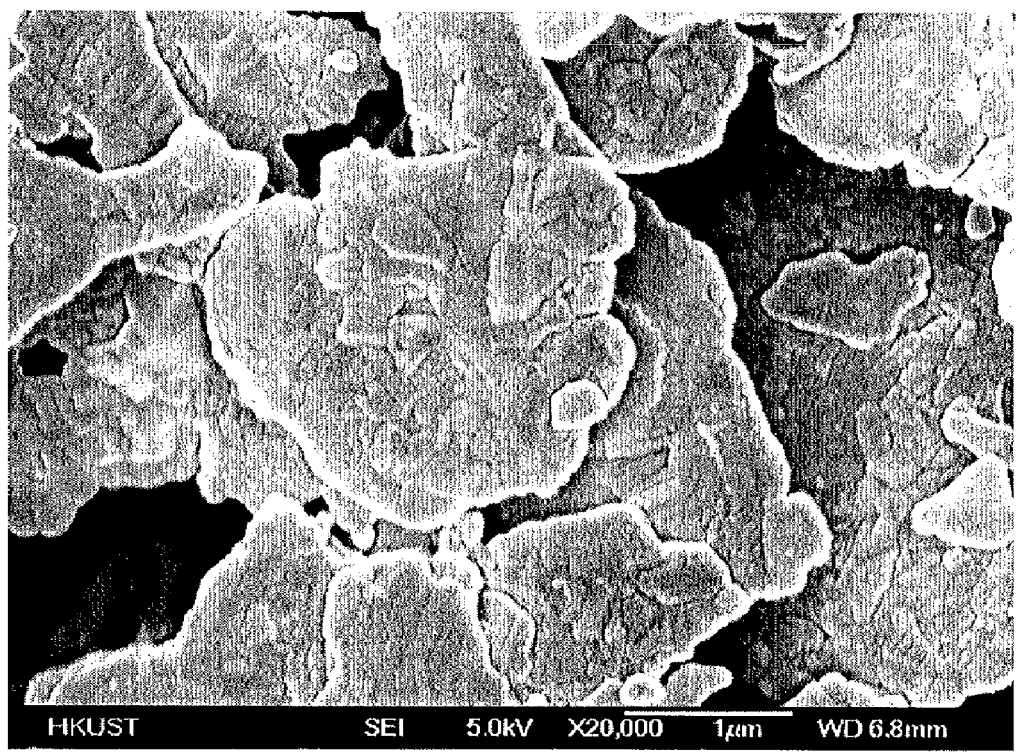
FIGS. 3A and 3B are SEM images of silver micro-flakes before and after surface treatment.
Figure 3B:
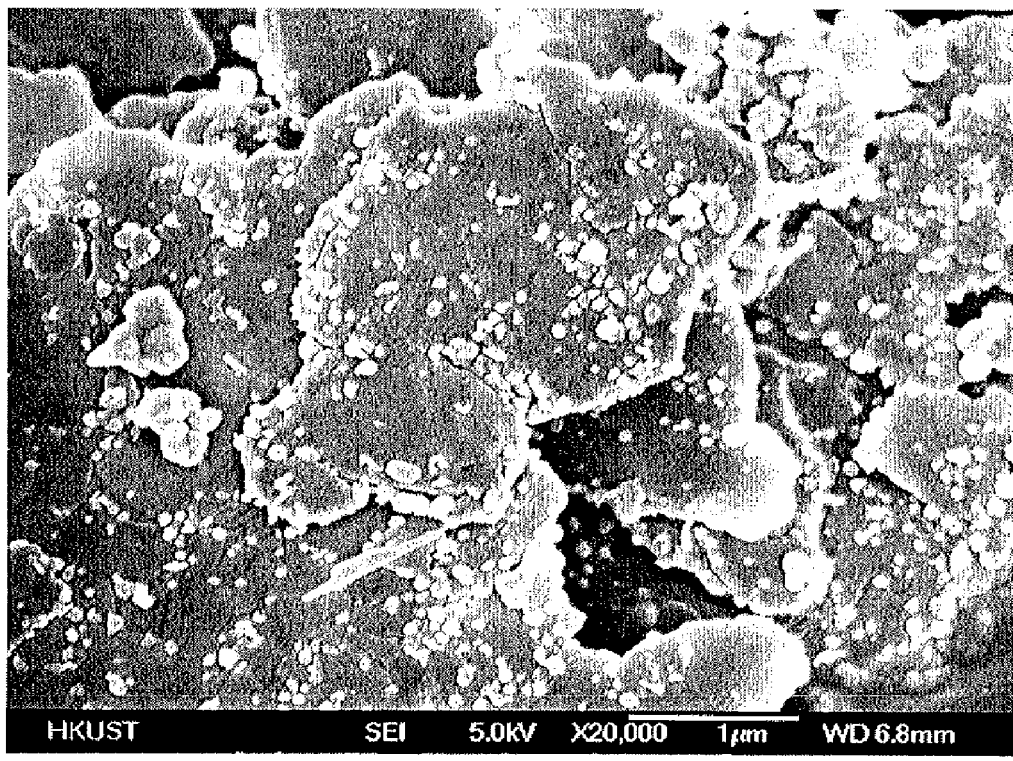

FIGS. 3A and 3B are SEM images of silver micro-flakes before and after surface treatment. In FIG. 3A, the silver micro-flakes are deposited, and can be placed in an aggregation of an adhesive, but must be densely packed to exhibit good electrical percolation. In FIG. 3B, the silver micro-flakes are treated with a halogen, and exhibit surface characteristics referred to as halogenations. The reaction can occur at room temperature, as most halogens (e.g. $Cl_2$, $Br_2$, and $I_2$) can rigorously react with silver. In the example configuration, the reaction is performed before mixing with resin.

The surface modification of the conductive fillers with the halogens, pseudohalogens or their precursors can be carried out in solvents. The solvents can include: ethanol, methanol, isopropanol, ethylene glycol, acetonitrile, chloroform, dichloromethane, tetrahydrofuran, dioxane, water, and others or the mixtures of them, which have solubility to the halogens or pseudohalogens or their precursors.

Effects of Nanoclusters on Micro-Flakes

Figures 4A, 4B:
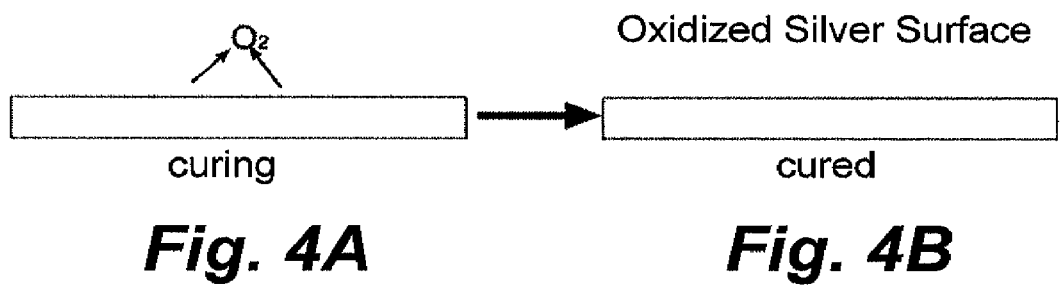
FIGS. 4A, 4B (prior art) are diagrams showing the effect of oxidization on a silver micro-flake.
Figures 5A, 5B:
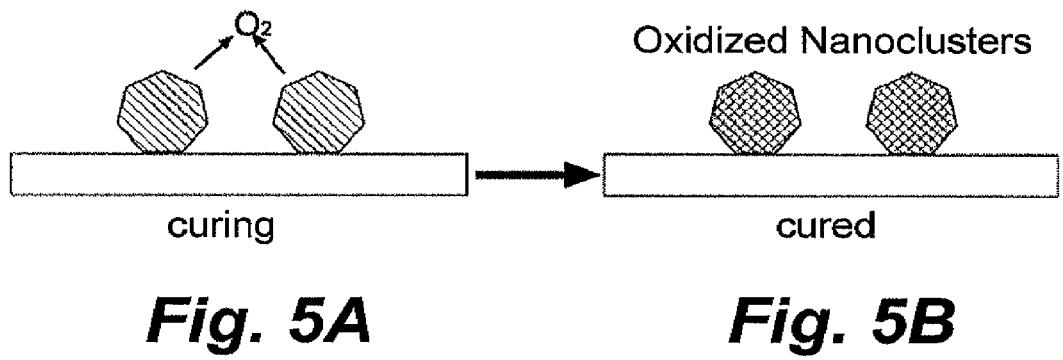
FIGS. 5A, 5B are diagrams showing the effect of oxidized nanoclusters on a silver micro-flake.

FIGS. 4A, 4B and FIGS. 5A, 5B are diagrams showing the effect of oxidized nanoclusters on a silver micro-flake. FIG. 4A represents a bare silver micro-flake while being cured. Electrons combine with oxygen to create an oxidized surface layer, as shown in FIG. 4B. In FIG. 5A, a silver micro-flake modified with nanoclusters formed as halogenations is depicted. The curing process results in the nanoclusters attracting oxygen, depicted in FIG. 5B, leaving the remaining surface of the silver micro-flake relatively free of oxide. The oxide-free silver micro-flake exhibits increased electrical percolation.

Example 1

Surface Modification of the Conductive Filler 10 g of micron-sized silver flakes (diameter about 5.6 microns) was dispersed into 100 ml ethanol solution of 0.02 wt % iodine. The solution was stirred mildly at room temperature for 30 minutes. Then the solution was filtered by using filter paper and the filtrate was washed 3 times with ethanol. The filtrate was vacuum-dried at room temperature until totally dried.

Preparation of the MECA: The following data are based on a silver adhesive formulation comprising 75% wt % silver. Actually the filler content can be in a wide range by adjusting the ratio between the filler weight and the resin pad.

8.2 g dried silver flakes were mixed with 1.5 g bisphenol-A type epoxy (EPON 828) and 1.3 g methyltetrahydrophthalic anhydride (MTHPA) using a high-shear mixer at the speed of 25,000 rpm for 30 minutes. Then 0.1 g 2-ethyl, 4-methyl imidazole was added and stirred for additional 3 minutes. The mixture was degassed for 5 minutes, screen printed, and cured at 150° C. for 15 minutes.

The resulting MECA sample is depicted as a SEM image of the cross-section profile in FIG. 2. The metal fillers used as conductive fillers exhibit excellent dispersion in the resin matrix.

Example 2

Sodium Chlorite Surface Modification Agent

MECA was prepared in the same manner as in EXAMPLE 1, except that the surface modification agent was not iodine but sodium chlorite. 10 g of micron-sized silver flakes (diameter about 5.6 microns) were dispersed into 100 ml ethanol solution of 0.02 wt % sodium chlorite. The solution was stirred mildly at room temperature for 30 minutes. The solution was then filtered by using filter paper and the filtrate was washed 3 times with ethanol. The filtrate was vacuum-dried at room temperature until totally dried.

Example 3

Bromine Surface Modification Agent

MECA was prepared in the same manner as in EXAMPLE 1, except that bromine was used as the surface modification agent instead of iodine. 10 g of micron-sized silver flakes (diameter about 5.6 microns) were dispersed into 100 ml ethanol solution of 0.025 wt % bromine. The solution was stirred mildly at room temperature for 30 minutes. The solution was then filtered by using filter paper and the filtrate was washed 3 times with ethanol. The filtrate was vacuum-dried at room temperature until totally dried.

Example 4

Sodium Chlorate Surface Modification Agent

MECA was prepared in the same manner as in EXAMPLE 1, except that sodium chlorate was used as the surface modification agent instead of iodine. 10 g of micron-sized silver flakes (diameter about 5.6 microns) were dispersed into 100 ml ethanol solution of 0.02 wt % sodium chlorate. The solution was stirred mildly at room temperature for 30 minutes. The solution was then filtered by using filter paper and the filtrate was washed 3 times with ethanol. The filtrate was vacuum-dried at room temperature until totally dried.

Comparative Example 1

Ctrl 1

ECA was prepared in the same manner as in EXAMPLE 1, except that the surface modification process for the silver flakes was not performed. The ECA samples which have an average thickness of 20 micron on a flat polyethylene terephthalate (PET) film was tested by using a 4-point probe tester according to the same procedure described below.

Comparative Example 2

Ctrl 2

ECA was prepared in the same manner as in EXAMPLE 1, except that 10 g of the silver flakes were washed by dispersing in 100 ml ethanol solution and dried. The ECA samples which have an average thickness of 20 micron on a thin polyethylene terephthalate (PET) film was tested by using a 4-point probe tester according to the same procedure described below.

Resistivity Analysis of the MECA

The volume resistivity of the MECA was carried out as follows: The MECA samples which have an average thickness of 20 micron on a thin polyethylene terephthalate (PET) film was tested by using a 4-point probe tester. The test results were averaged based on more than 20 data points. Further, after the sample was aged at 85° C. and 85% relative humidity for 200 hours, volume resistivity was evaluated by using a 4-point probe tester.

Figure 6:
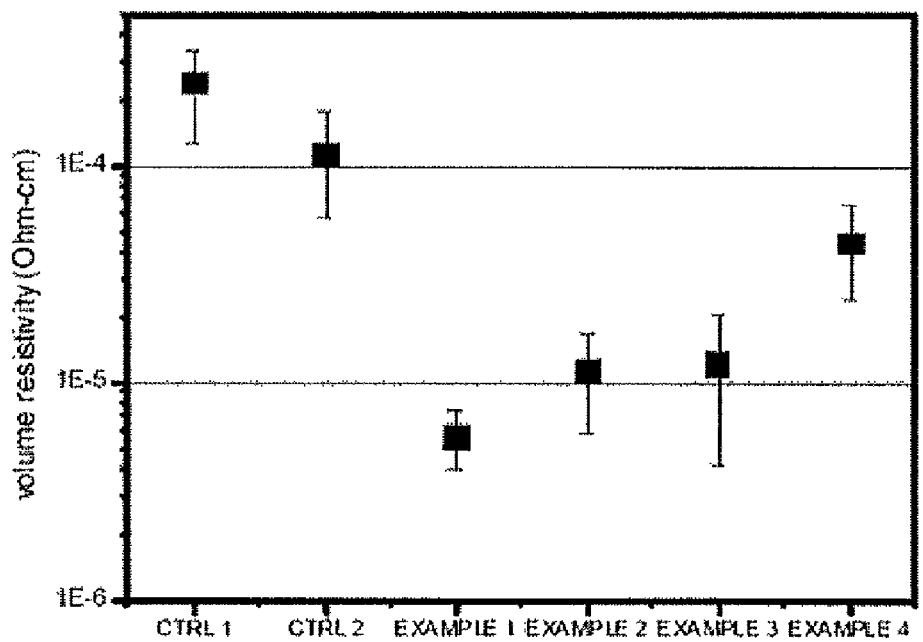
FIG. 6 is a schematic illustration of a comparison of the volume resistivity of the control ECA sample and a series of MECAs.

FIG. 6 is a schematic illustration of a comparison of the volume resistivity of the control ECA sample and a series of MECAs in each example. The volume resistivity results were collected from a 4-point tester. This figure shows that the example samples all exhibit better conductivity than the control samples.

Figure 7:
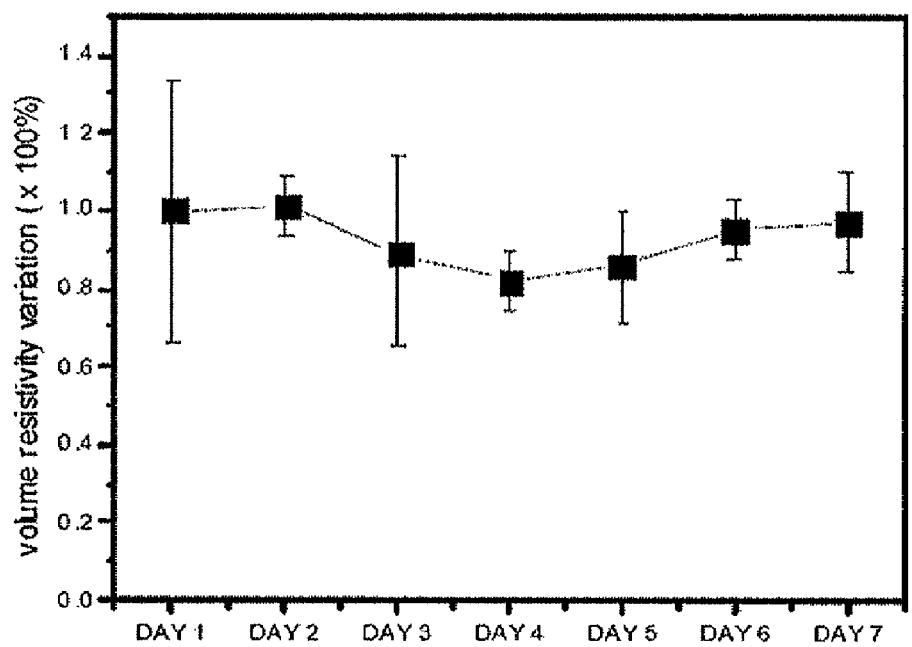
FIG. 7 is a schematic illustration of the reliability property of a MECA sample.

FIG. 7 is a schematic illustration of the reliability property of the MECA sample in EXAMPLE 1. The volume resistivity results were collected from a 4-point tester at 85° C. and 85% relative humidity. This figure illustrates the MECA sample shows excellent reliability in its conductivity.

Figure 8:
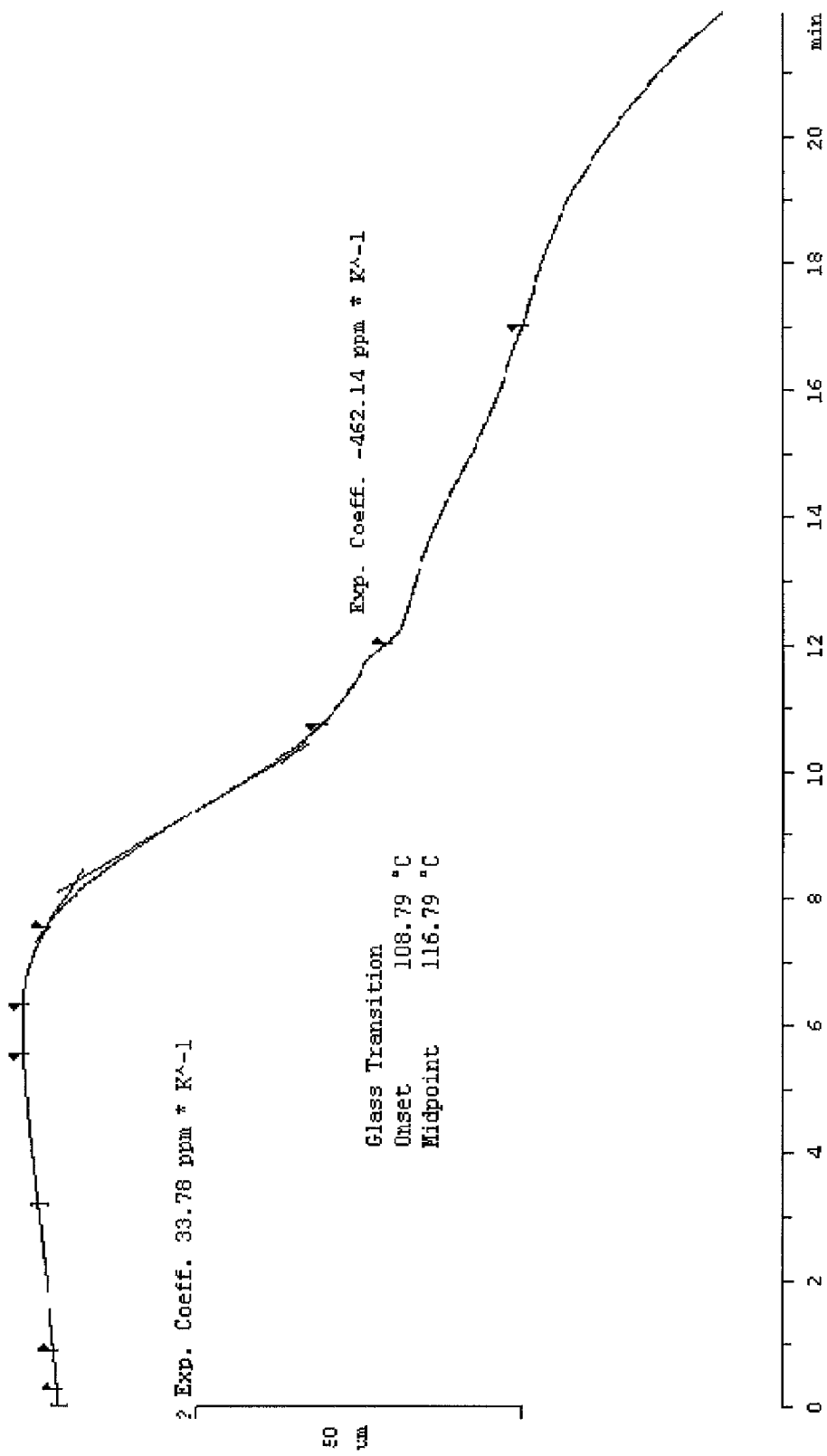
FIG. 8 is a schematic illustration of the thermal expansion property of the MECA sample of FIG. 7.

FIG. 8 is a schematic illustration of the thermal expansion property of the MECA sample in EXAMPLE 1. The data was collected from thermomechanical analysis (TMA). The coefficient of thermal expansion of this MECA sample is only about 34 ppm/K below $T_g$ (about 117° C.).

Figure 9:
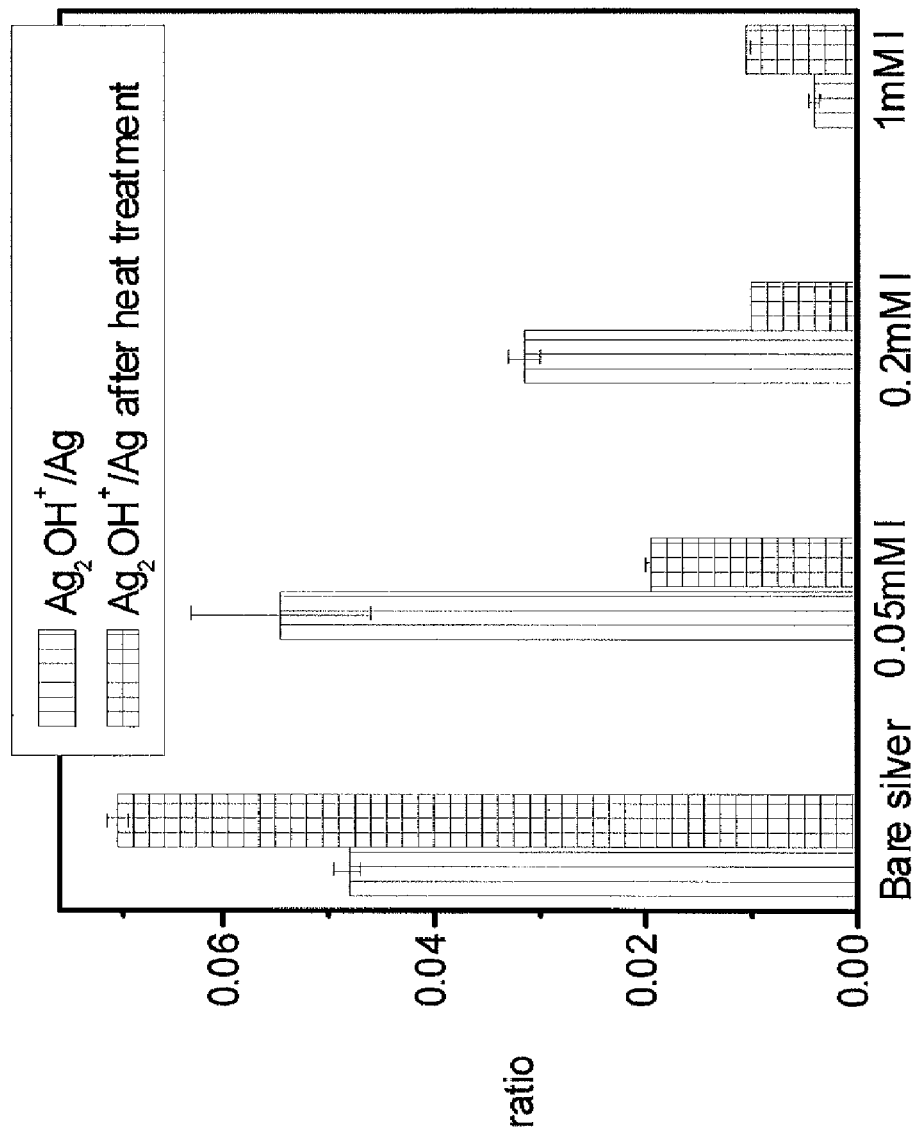
FIG. 9 is the peak intensity ratio of silver oxide fragment to silver base peak at the surface of different samples from a TOF-SIMS analysis.

FIG. 9 is the peak intensity ratio of silver oxide fragment ($Ag_2OH^+$ 233 m/z) to silver base peak ($Ag^+$ 108 m/z) at the surface of different samples from the TOF-SIMS analysis. Compared with the bare silver surface, the iodine treated silver samples showed decreased peak intensity after heat treatment. The samples were covered by bisphenol-A resin formulation (without catalyst) first and then heated at 150° C. for 15 minutes and the resin residues have been carefully washed away before TOF-SIMS analysis. At higher concentration of iodine treatment (1 mM I solution), the silver oxide fragments were significantly inhibited. This result shows that the surface modification of iodine can significantly inhibit the oxidation of the silver surface.

Physical Structure

Figure 10:
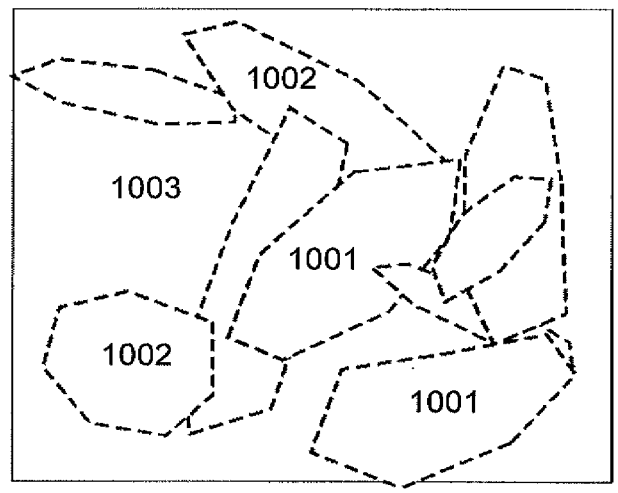
FIG. 10 is a schematic illustration of the surface-modified conductive fillers which are embedded in resin to form a MECA.

FIG. 10 is a schematic illustration of the surface-modified conductive fillers which are embedded in resin to form a MECA. Depicted are fillers 1001, halide or pseudohalide containing layer 1002, and resin matrix 1003 in the MECA.

Figure 11:
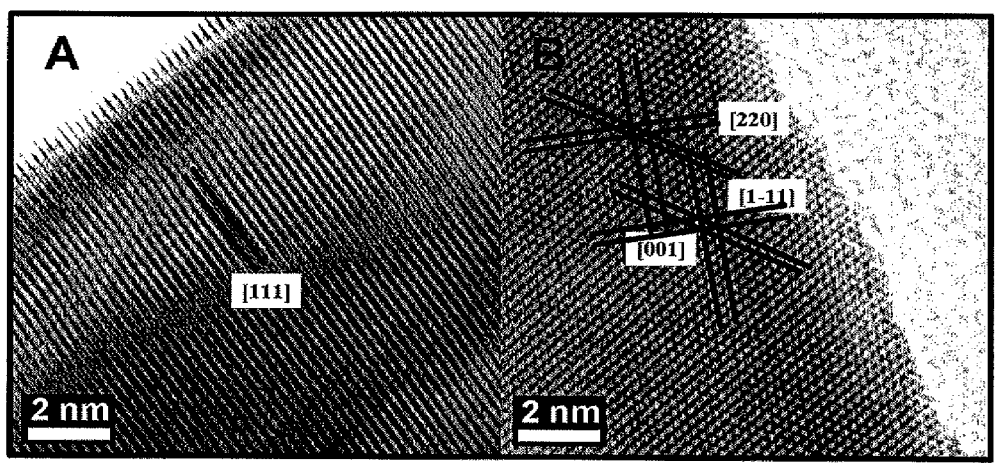
FIG. 11 is a High-Resolution Transmission Electron Microscopy (HRTEM) image of a cross-section of modified ECA sample with 75% silver loading.

FIG. 11 is a High-Resolution Transmission Electron Microscopy (HRTEM) image of a cross-section of a modified ECA (MECA) sample with 75% silver loading. Shown are a surface modified silver flake, depicted at A, and a bare silver flake, depicted at B. Surface modified silver flake, depicted at A, may be produced as the MECA sample prepared in EXAMPLE 1. This figure demonstrates the elemental composition of the silver, showing the areas except for the halogenation sites. The numbers in the square brackets represent the crystalline parameters of silver flakes.

Figure 12A:
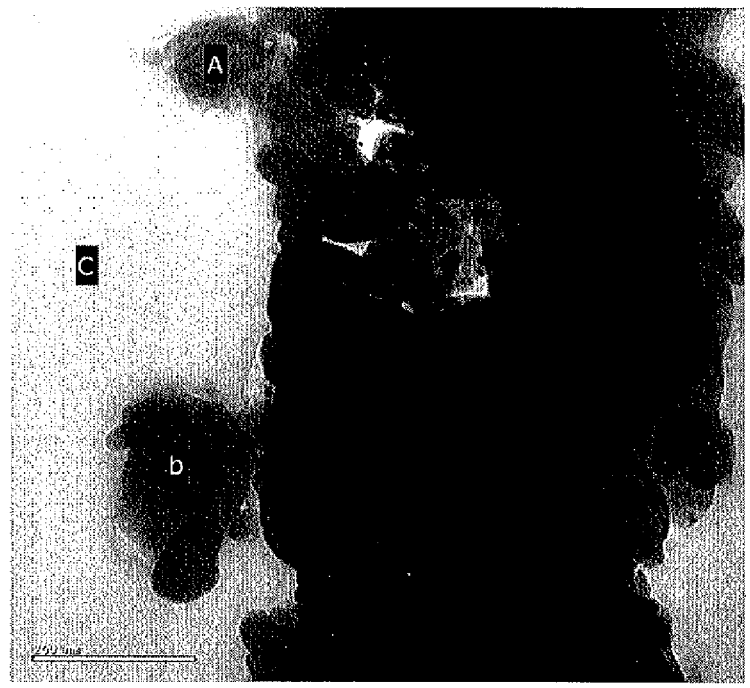
FIG. 12A is a SEM photomicrograph of a silver-silver iodide nano-structures on a cross-section of ECA sample.
Figure 12B:
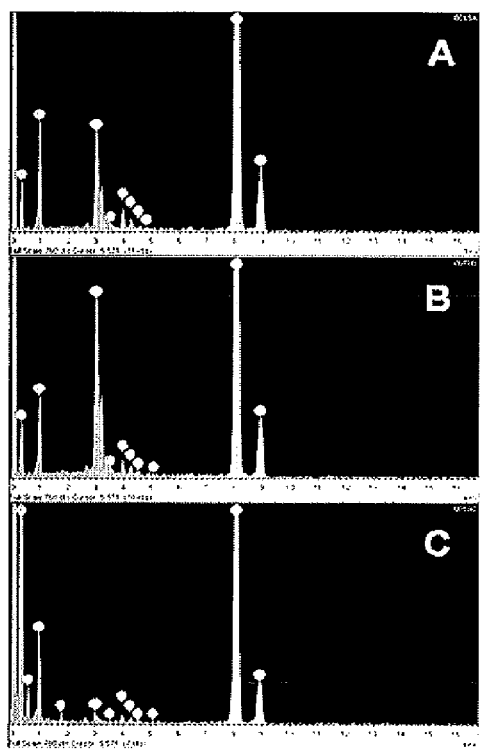
FIG. 12B is a set of graphical depictions of Transmission Electron Microscopy-Energy Dispersive Spectroscopy (TEM-EDS) analysis of the structure of FIG. 12A.

FIGS. 12A and 12B represent a TEM-EDS study of the silver-silver iodide nano-structures on a cross-section of a MECA sample. FIG. 12A is a TEM photomicrograph of a silver-silver iodide nano-structures on a cross-section of MECA sample, and shows nanoclusters formed on the silver by the reaction between halogen and silver. Region A is nanocluster 1; Region B is nanocluster 2, and Region C is a bisphenol-A type resin part, used as a control. The cross-section has a thickness of 60 nm. FIG. 12B is a set of graphical depictions of Transmission Electron Microscopy-Energy Dispersive Spectroscopy (TEM-EDS) analysis of the structure of FIG. 12A. The graphs in FIG. 12B are Transmission Electron Microscopy-Energy Dispersive Spectroscopy (TEM-EDS) graphs corresponding to Regions A, B and C of FIG. 12A. The MECA sample prepared according to the method in EXAMPLE 1 was used, with 25 fold higher in iodine concentration.

The TEM image shown here is a sample with higher iodine treatment concentration (25 times higher) than the one in EXAMPLE 1, for purposes of displaying the nanoclusters in the image. This condition provides a condition in which the nanostructures can be more easily seen in the image. If significantly lower concentrations are used, such as is the case given in EXAMPLE 1, there would be only a few nanoclusters deposited on the surface, and that would be more difficult to observe.

Figure 13:
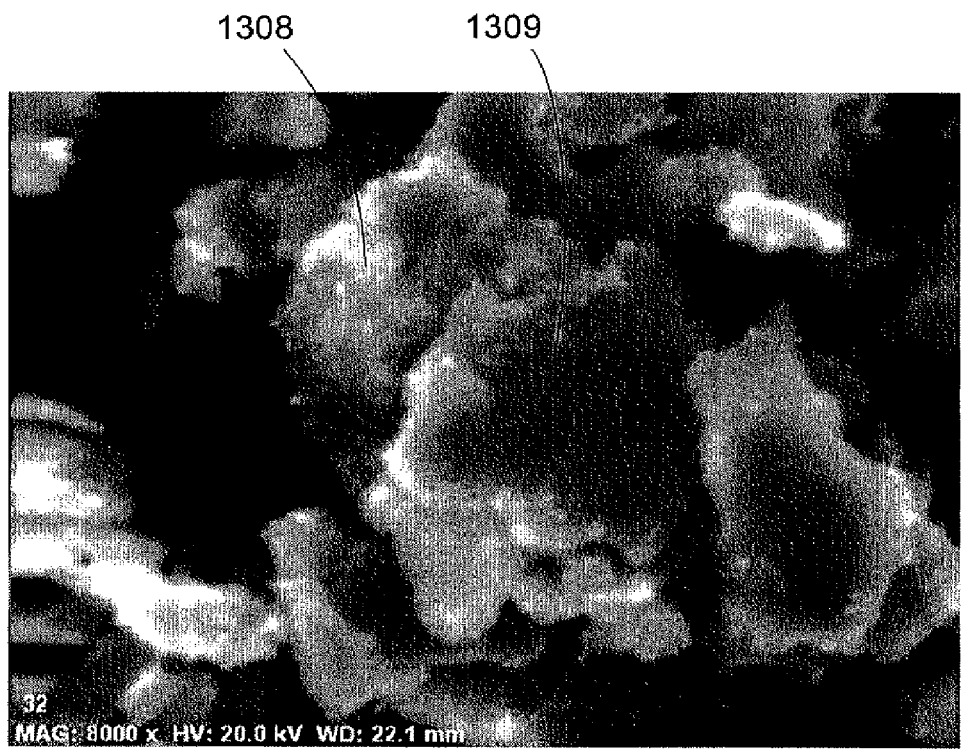
FIG. 13 is a SEM photomicrograph of a silver-silver iodide nano-structures on a modified silver microflake sample.

FIG. 13 is an scanning electron microscopy (a SEM) analysis photomicrograph of modified silver microflake sample. The white dots in FIG. 13 are the nano-structures of the silver-silver iodide complexes, which were confirmed with the Scanning Electron Microscopy-Energy Dispersive Spectroscopy (SEM-EDS) analysis The numbers 28 and 29 are different regions depicting those with nanostructures and without.

The elemental distribution represented by FIG. 13 (according to SEM-EDS analysis) is as follows:

| Spectrum | C Mass percent (%) | Ag Mass percent (%) | I Mass percent (%) |
|---|---|---|---|
| Object 1308 | 2.37 | 88.13 | 2.20 |
| Object 1309 | 2.41 | 90.28 | — |

Figure 14:
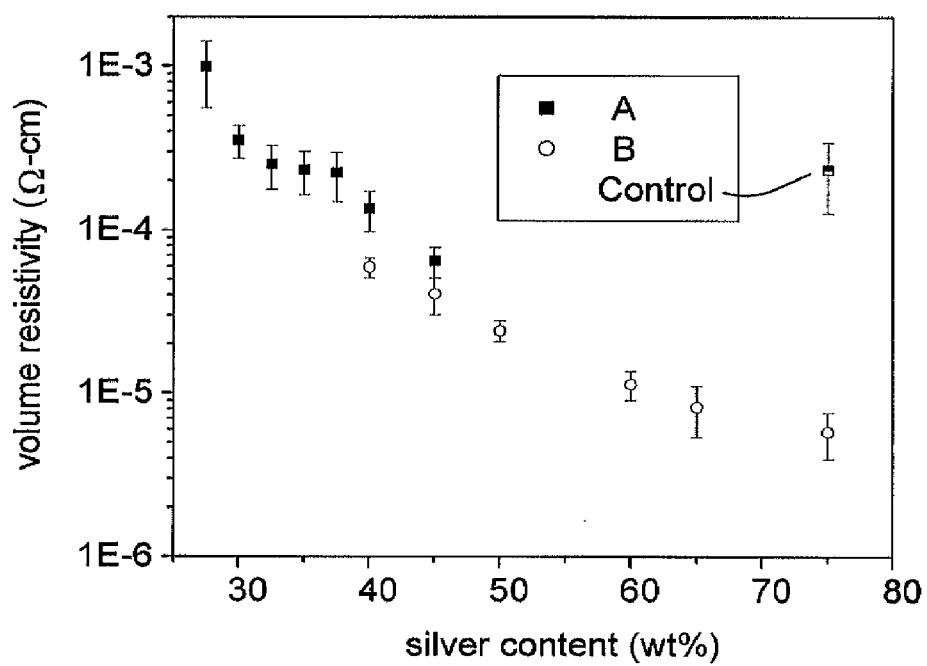
FIG. 14 is a graphical depiction of volume resistivity data of volume resistivity data of the modified ECAs.

FIG. 14 is a graphical depiction of volume resistivity data of the modified ECAs with different filler content. The preparation route followed the method in EXAMPLE 1, with different epoxy type. A is Novolac type epoxy and B is bisphenol-A type epoxy.

Physical and Electrical Properties of the Materials

Silver halides, such as silver iodide, exhibit super-ionic conductivity behavior at certain crystal phases which exhibit higher interstitial rate, vacancies, and Frenkel defects. People have studied their special electrical properties for decades. Meanwhile, the formation of silver halides can adopt a special Osterwald Ripening process. Via this process, the metal oxide layer can be cleared out from the metal surface and they are transformed into isolated nano-structures of metal halides or metal pseudohalides littered at the metal surface. Since the insulative metal oxide is removed, the remaining surface is clean and thus has higher electrical conductivity thereof. From the high resolution transmission electron microscopy (HRTEM) studies (FIG. 11), it was observed that after the surface modification, the metal surface is very pure metal crystal, except for the nano-structure parts.

From the TEM-EDS analysis depicted in FIGS. 12A and 12B, it was observed that the elemental ratio between the metal and halogen are not stoichiometrically equivalent. TEM-EDS result showed there were more metal than halogen inside the nano-structures. These metal molecular clusters can be oxidized during the curing process, as can be seen by the graphical depiction of FIG. 9. It was observed that the $Ag_2OH^+$ fragments in the silver flake sample, prepared according to EXAMPLE 1, are less than the bare silver flake sample (e.g., the control). This result shows that the nano-structures are easily oxidized, while the etched metal surface is not as susceptible to be oxidized as compared with the control bare silver sample.

Characteristics of the MECAs

After curing, the MECAs gain improved features as compared with many other currently available ECAs. The characteristics include, but are not limited to, bulk resistivity, contact resistance shift, coefficient of thermal expansion, glass transition temperature, curing temperature, storage modulus G', loss modulus G", Young's modulus, fracture toughness, flexural strain at break, flexural strength, adhesion strength, viscosity, moisture absorption, and thermal stability. It should be noted that selection of the components of the MECA can alter the values of the characteristics and therefore, the MECAs can be designed for particular applications.

Configurations of the MECA can have a bulk resistivity from $10^{-2}$ ohm-cm to $10^{-6}$ ohm-cm.

Configurations of the MECA can have a contact resistance that changes less than about 15% after 200 hours' aging at 85° C./85% relative humidity.

Configurations of the MECA can have a coefficient of thermal expansion before the glass transition temperature ($T_g$) is reached of about 5 ppm/° C. to 80 ppm/° C.

Configurations of the MECA can have a glass transition temperature ($T_g$) of about 80° C. to 200° C.

Configurations of the MECA can have a curing temperature from about 25° C. to 200° C. and a curing time from 1 second to 120 minutes.

Configurations of the MECA can have moisture absorption of about 0.1 to 2.5 wt %.

Configurations of the MECA can have thermal stability of about 100 to 600° C.

The MECA can include, but are not limited to, a polymer resin, a hardener used as a crosslinking agent, and the surface-modified conductive metal fillers. The polymer resin matrix resin can include, but is not limited to, an epoxy resin, such as polyurethane, cyanate ester, polyimide, silicone, and other thermoplastics (e.g., maleimides, preimidized polyimides, hot melt thermoplastics and the like), silicone-epoxy blends, thermosets, thermoset-thermoplastic blends, and combinations thereof. In addition, the MECA can include other components such as, but not limited to, an adhesion promoter, a curing accelerator, a corrosion inhibitor, and so forth.

The epoxy resin can include, but is not limited to, bisphenol-A type epoxy resins, bisphenol-F type epoxy resins, cycloaliphatic epoxy resins, epoxy novolac resins, biphenyl type epoxy resins, naphthalene type epoxy resins, dicyclopentadiene-phenol type epoxy resins, and combinations thereof.

The polyimide, silicone and other materials can include, but are not limited to, phenylene pyromellitimide dianhydride (PMDA-ODA), PMDA Benzidine, oxydiphthalic dianhydride (ODPA), dimethysiloxane, methyphenylsiloxane, diphenylsiloxane, methytrifluorosiloxane, silicone-epoxy copolymer, and combinations thereof.

The thermoplastics can include, but are not limited to, preimidized polyimides, maleimides, hot melt thermoplastics, and combinations thereof. The thermoset polymers can include, but are not limited to, epoxies, polyimides, cyanate esters, silicones, and combinations thereof.

The silicone-epoxy blends can include blends such as, but not limited to, dimethysiloxane, methyphenylsiloxane, diphenylsiloxane, trifluoro-methysiloxane, trifluorophenyl-siloxane with any epoxy functional groups, and combinations thereof. The polymer resin matrix resin is about 1 to 99 wt % of the MECA. The variation in the concentration of metal filler is used in particular applications. High concentrations of metal filler improve conductivity of the adhesive, whereas low concentration of metal filler is viable when the aspect ratio of the filler is very high. Examples of high aspect ratio fillers include silver nanowire and silver nanofoil. Percolation theory allows very low conductive filler content.

The surface-modified conductive filler can include, but is not limited to, silver, nickel, copper, aluminum, palladium, platinum, gold, combinations thereof, and alloys thereof. The conductive filler can have particle sizes in the range of about 50 nm to about 50 micrometers. The conductive filler is about 1 to 99 wt % of the MECA, with the concentration depending on the type of filler and the particular application.

The hardener can include compounds suitable for hardening the MECA composition such as, but not limited to, amines (e.g., tertiary amines aliphatic amines, and aromatic amines), anhydrides (e.g., carboxylic acid anhydrides), thiols, alcohols, phenols, isocyanates, boron complexes, inorganic acids, hydrazides, and imidazoles. In addition, the hardener can include derivatives of the compounds listed above for the hardener or crosslinking agent.

The halogens or pseudohalogens or their precursors for the surface treatment can be: chlorine, bromine, iodine, metal chlorite, metal chlorate, metal hyperchlorite, metal bromite, metal bromate, metal hyperbromite, metal iodite, metal iodate, metal hyperiodite; pseudohalogens can be: cyanide, cyanate, thiocyanate, halogen-cyanide, halogen-cyanate, halogen-thiocyanate, and metal salts of the above anions. A mixture of the above chemicals is also included.

The components of the MECA can be mixed and applied to a substrate to which solder can be disposed, and then cured. The curing can be performed at about 100 to 180° C. for a curing time of about 1 to 120 minutes. The cured MECA has the characteristics as described above. It should be emphasized that the above-described embodiments of the present disclosure are merely possible examples of implementations and are merely set forth for a clear understanding of the principles of the disclosure. Many variations and modifications may be made to the above-described examples.

CONCLUSION

It will be understood that many additional changes in the details, materials, steps and arrangement of components, which have been herein described and illustrated to explain the nature of the subject matter, may be made by those skilled in the art within the principle and scope of the invention as expressed in the appended claims.

What is claimed is:

1. An electroconductive bonding material comprising:
a thermosetting or thermoplastic polymer resin matrix; and
a conductive filler material comprising a surface modified with nano-structures embedded within the resin matrix and modified by applying a material selected from one of halogens, pseudohalogens or their precursors, the halogens selected from the group consisting of bromine, iodine, metal bromite, metal bromate, metal hyperbromite, metal iodite, metal iodate, metal hyperiodite, and the pseudohalogens or their precursors selected from the group consisting of cyanide, cyanate, thiocyanate, halogen-cyanide, halogen-cyanate, halogen-thiocyanate, and metal salts of the above anions wherein the modified conductive filler material embedded within the resin matrix provides a modified electrically conductive adhesive (MECA).

2. The electroconductive bonding material of claim 1, comprising resin in a concentration of 1-99% by weight percent, a concentration of the conductive filler of 1-99% by weight percent, and a hardener or crosslinking agent.

3. The electroconductive bonding material of claim 1, wherein the polymer resin matrix comprises a thermoplastic, comprising a material selected from the group consisting of least one of preimidized polyimides, maleimides, and hot melt thermoplastics.

4. The electroconductive bonding material of claim 1, wherein the polymer resin matrix comprises a hot melt thermoplastic vinyl polymer.

5. The electroconductive bonding material of claim 1, wherein the polymer resin matrix comprises a thermoset polymer, selected from the group consisting of at least one of epoxies, polyimides, cyanate esters, silicones, and combinations thereof.

6. A method of forming an electroconductive bonding material as described in claim 1, the method comprising:
providing a thermosetting or thermoplastic resin-based polymer resin matrix;
providing a metal filler material suitable for use as conductive filler for the resin matrix;
modifying the conductive filler by applying a material selected from the group consisting of halogens, pseudohalogens or their precursors; and
combining the resin matrix and the conductive filler material, wherein the combining of the resin matrix and the conductive filler and the modifying of the conductive filler results in a modified electrically conductive adhesive (MECA).

7. The method of claim 6, further characterized by modifying the conductive filler prior to combining the resin matrix and the conductive filler.

8. The method of claim 6, further characterized by modifying the conductive filler subsequent to or during combining the resin matrix and the conductive filler.

9. The method of claim 6, comprising generating nano-structures at the surface of the filler materials, said nano-islands formed of non-stoichiometrically equivalent metal halides or metal pseudohalides, and containing metallic molecular clusters.

10. The method of claim 6, wherein the modifying of the conductive filler reduces bulk resistivity of the MECA, thereby resulting in an increase in the electrical percolation of the MECA by reducing the percolation threshold of the MECA.

11. The method of claim 6, wherein the modifying the conductive filler reduces bulk resistivity of the ECA from about $10^{-0.5}$ ohm-cm to about $10^{-6}$ ohm-cm, thereby resulting in improvement in the percolation property of the ECA.

12. The method of claim 6, wherein the modifying the conductive filler reduces bulk resistivity of the ECA from about $10^{-2}$ ohm-cm to about $10^{-4}$ ohm-cm, thereby resulting in improvement in the percolation property of the ECA.

13. The method in claim 6, wherein the modifying of the conductive filler generates nano-structures formed of the non-stoichiometrically equivalent metal halides or metal pseudohalides at the surface of the fillers.

14. The method in claim 6, wherein the modifying of the conductive filler generates nano-structures formed of the non-stoichiometrically equivalent metal halides or metal pseudohalides at a surface layer having a thickness in the range from 0.5 nanometer to 1 micrometer.

15. The method in claim 6, wherein:
the resin matrix comprises about 1 to 99% by weight a resin, about 1 to 99% by weight percent conductive filler, and a hardener or crosslinking agent; and
the metal filler material comprises at least one conductive metal selected from the group of silver, nickel, copper, aluminum, palladium, platinum, gold, combinations thereof, and alloys thereof.

16. The method of claim 6, wherein the polymer resin matrix comprises a thermoplastic selected from the group consisting of preimidized polyimides, maleimides, hot melt thermoplastics.

17. The method of claim 6, wherein the polymer resin matrix comprises a hot melt thermoplastic vinyl polymer.

18. The method of claim 6, wherein the polymer resin matrix comprises a thermoset polymer, selected from the group consisting of epoxies, polyimides, cyanate esters, silicones, and combinations thereof.

19. The method of claim 6, wherein the polymer resin matrix comprises an epoxy resin selected from the group consisting of bisphenol-A type epoxy resins, bisphenol-F type epoxy resins, cycloaliphatic epoxy resins, epoxy novolac resins, bisphenol type epoxy resins, naphthalene type epoxy resins, dicyclopentadiene-phenol type epoxy resins, and combinations thereof.

20. The method of claim 6, wherein the polymer resin matrix comprises a polyimide selected from the group consisting of phenylene pyromellitimide dianhydride (PMDA-ODA), PMDA Benzidine, oxydiphthalic dianhydride (ODPA), dimethysiloxane, methyphenylsiloxane, diphenylsiloxane, methytrifluorosiloxane, silicone-epoxy copolymer, and combinations thereof.

21. The method of claim 6, wherein the polymer resin matrix comprises a silicone-epoxy blend selected from the group consisting of dimethysiloxane, methyphenylsiloxane, diphenylsiloxane, trifluoro-methysiloxane, trifluorophenylsiloxane with any epoxy functional groups, and combinations thereof.

22. The method of claim 6, comprising modifying the conductive filler by effecting a solution base surface reaction between the metal fillers and the halogens or pseudohalogens or their precursors, and using an other organic solvents capable of dissolving the halogens or pseudohalogens or their precursors or using a solvent selected from the group consisting of ethanol, iso-propanol, acetone and acetonitile.

23. The surface method of claim 6, wherein the halogens or pseudohalogens or their precursors for the surface treatment comprise materials selected from the group consisting of bromine, iodine, metal bromite, metal bromate, metal hyperbromite, metal iodite, metal iodate, metal hyperiodite, cyanide, cyanate, thiocyanate, halogen-cyanide, halogen-cyanate, halogen-thiocyanate, and metal salts of the above anions.

24. An electroconductive bonding material comprising:
a thermosetting or thermoplastic polymer resin matrix; and
a conductive filler material comprising a surface modified with nano-structures embedded within the resin matrix and modified by applying a material selected from one of halogens or pseudohalogens or their precursors, wherein the modified conductive filler material embedded within the resin matrix provides a modified electrically conductive adhesive (MECA),
and wherein the polymer resin matrix comprises an epoxy resin selected from the group consisting of bisphenol-A type epoxy resins, bisphenol-F type epoxy resins, cycloaliphatic epoxy resins, epoxy novolac resins, bisphenol type epoxy resins, naphthalene type epoxy resins, and dicyclopentadiene-phenol type epoxy resins.

25. An electroconductive bonding material comprising:
a thermosetting or thermoplastic polymer resin matrix; and
a conductive filler material comprising a surface modified with nano-structures embedded within the resin matrix and modified by applying a material selected from one of halogens or pseudohalogens or their precursors, wherein the modified conductive filler material embedded within the resin matrix provides a modified electrically conductive adhesive (MECA),
and wherein the polymer resin matrix comprises a material selected from the group consisting of phenylene pyromellitimide dianhydride (PMDA-ODA), PMDA Benzidine, oxydiphthalic dianhydride (ODPA), dimethysiloxane, methyphenylsiloxane, diphenylsiloxane, methytrifluorosiloxane, and silicone-epoxy copolymer.

26. The electroconductive bonding material of claim 25, wherein the polymer resin matrix comprises a polyimide selected from the group consisting of phenylene pyromellitimide dianhydride (PMDA-ODA) and PMDA Benzidine.

27. The electroconductive bonding material of claim 25, wherein the polymer resin matrix comprises oxydiphthalic dianhydride (ODPA).

28. The electroconductive bonding material of claim 25, wherein the polymer resin matrix comprises a silicone selected from the group consisting of dimethysiloxane, methyphenylsiloxane, diphenylsiloxane, methytrifluorosiloxane, and silicone-epoxy copolymer.

29. An electroconductive bonding material comprising:
a thermosetting or thermoplastic polymer resin matrix; and
a conductive filler material comprising a surface modified with nano-structures embedded within the resin matrix and modified by applying a material selected from one of halogens or pseudohalogens or their precursors, wherein the modified conductive filler material embedded within the resin matrix provides a modified electrically conductive adhesive (MECA),
and wherein the polymer resin matrix comprises a silicone-epoxy blend including components selected from the group consisting of dimethysiloxane, methyphenylsiloxane, diphenylsiloxane, trifluoro-methysiloxane, or trifluorophenylsiloxane, in combination with any epoxy functional groups.

* * * * *